(12) United States Patent
Takechi et al.

(10) Patent No.: US 11,448,704 B2
(45) Date of Patent: Sep. 20, 2022

(54) PARAMETER ESTIMATION DEVICE, PARAMETER ESTIMATION METHOD, AND COMPUTER PROGRAM

(71) Applicant: SUMITOMO ELECTRIC INDUSTRIES, LTD., Osaka (JP)

(72) Inventors: Hiroaki Takechi, Osaka (JP); Tomomi Kataoka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 44 days.

(21) Appl. No.: 17/050,535

(22) PCT Filed: Jan. 10, 2019

(86) PCT No.: PCT/JP2019/000538
§ 371 (c)(1),
(2) Date: Oct. 26, 2020

(87) PCT Pub. No.: WO2019/230033
PCT Pub. Date: Dec. 5, 2019

(65) Prior Publication Data
US 2021/0190876 A1   Jun. 24, 2021

(30) Foreign Application Priority Data

May 31, 2018   (JP) .............................. JP2018-105347

(51) Int. Cl.
*G01R 31/3842* (2019.01)
*G01R 31/396* (2019.01)
(Continued)

(52) U.S. Cl.
CPC ....... *G01R 31/3842* (2019.01); *G01R 31/367* (2019.01); *G01R 31/388* (2019.01); *G01R 31/396* (2019.01)

(58) Field of Classification Search
CPC .............. G01R 31/3842; G01R 31/396; G01R 31/388; G01R 31/367
See application file for complete search history.

(56) References Cited

U.S. PATENT DOCUMENTS

| 2010/0153038 A1* | 6/2010 | Tomura .............. G01R 31/3842 702/63 |
| 2013/0169281 A1 | 7/2013 | Baba et al. |

(Continued)

FOREIGN PATENT DOCUMENTS

| JP | 2012-058028 A | 3/2012 |
| JP | 2012-058089 A | 3/2012 |

(Continued)

OTHER PUBLICATIONS

Shuichi, Adachi et al., "Adaptive Estimation Method Using Recursive Least Squares Method", Battery Management System Engineering, Tokyo Denki University Press, Chapter 6.2.2.

(Continued)

*Primary Examiner* — Natalie Huls
*Assistant Examiner* — Sharad Timilsina
(74) *Attorney, Agent, or Firm* — Oliff PLC

(57) ABSTRACT

A parameter estimation device configured to estimate a parameter of an equivalent circuit model of a secondary battery includes: a voltage acquisition unit configured to acquire a voltage of the secondary battery in a time-series manner; a current acquisition unit configured to acquire a charge/discharge current of the secondary battery in a time-series manner; an estimation unit configured to estimate the parameter on the basis of the voltage acquired by the voltage acquisition unit and the charge/discharge current acquired by the current acquisition unit; and a prohibition unit configured to prohibit the estimation of the parameter performed by the estimation unit, on the basis of the charge/discharge current acquired by the current acquisition unit or the voltage acquired by the voltage acquisition unit.

7 Claims, 16 Drawing Sheets

(51) Int. Cl.
 G01R 31/388 (2019.01)
 G01R 31/367 (2019.01)

(56) References Cited

U.S. PATENT DOCUMENTS

| | | | |
|---|---|---|---|
| 2013/0185008 A1* | 7/2013 | Itabashi | H01M 10/486 |
| | | | 702/63 |
| 2016/0252585 A1 | 9/2016 | Baba et al. | |

FOREIGN PATENT DOCUMENTS

| | | |
|---|---|---|
| JP | 2012-063251 A | 3/2012 |
| JP | 2014-202630 A | 10/2014 |
| JP | 2015-081800 A | 4/2015 |
| JP | 2015-224919 A | 12/2015 |
| JP | 2015-224927 A | 12/2015 |
| JP | 2015224919 A * | 12/2015 |
| JP | 2016-156771 A | 9/2016 |

OTHER PUBLICATIONS

Mar. 19, 2019 Search Report issued in International Patent Application No. PCT/JP2019/000538.

\* cited by examiner

PARAMETER ESTIMATION DEVICE, PARAMETER ESTIMATION METHOD, AND COMPUTER PROGRAM

TECHNICAL FIELD

The present disclosure relates to a parameter estimation device, a parameter estimation method, and a computer program. This application claims priority on Japanese Patent Application No. 2018-105347 filed on May 31, 2018, the entire content of which is incorporated herein by reference.

BACKGROUND ART

In recent years, electrically driven vehicles such as HVs (hybrid vehicles), PHVs (plug-in hybrid vehicles), and EVs (electric vehicles) are rapidly becoming prevalent. In electrically driven vehicles, in order to efficiently control a battery, it is necessary to accurately estimate the state of the battery.

For example, PATENT LITERATURE 1 describes a battery parameter estimation device that estimates, on the basis of a charge/discharge current value and a terminal voltage value of a battery (secondary battery), parameters in a battery equivalent circuit model that approximates a Warburg impedance of a battery. This parameter estimation device is alleged to be able to simultaneously estimate parameters of the battery equivalent circuit model and the internal resistance of the battery.

PATENT LITERATURE 2 describes a parameter estimation device having a state estimation part that estimates, by using a Kalman filter, parameters of an equation of state of a battery equivalent circuit model having a resistor and a capacitor. A charge/discharge current value and a terminal voltage value previously processed by a low-pass filter are inputted to the battery equivalent circuit. For the time constant of the low-pass filter, an after-correction time constant $\tau C$ obtained as a product of a time constant $\tau$ corresponding to the battery temperature, a state-of-health correction factor $\lambda H$ of the battery, and a state-of-charge correction factor $\lambda c$ is used.

Further, PATENT LITERATURE 3 describes a storage battery deterioration diagnostic device that identifies, on the basis of a relational expression indicating a relationship between a terminal voltage uL, a current i, an open-circuit voltage OCV, and internal impedances Ra, Rb, Cb of a storage battery (battery), Ra, Rb, Cb, and OCV.

CITATION LIST

Patent Literature

PATENT LITERATURE 1: Japanese Laid-Open Patent Publication No. 2015-81800
PATENT LITERATURE 2: Japanese Laid-Open Patent Publication No. 2012-63251
PATENT LITERATURE 3: Japanese Laid-Open Patent Publication No. 2016-156771

SUMMARY OF INVENTION

A parameter estimation device according to an aspect of the present disclosure is configured to estimate a parameter of an equivalent circuit model of a secondary battery. The parameter estimation device includes: a voltage acquisition unit configured to acquire a voltage of the secondary battery in a time-series manner; a current acquisition unit configured to acquire a charge/discharge current of the secondary battery in a time-series manner; an estimation unit configured to estimate the parameter on the basis of the voltage acquired by the voltage acquisition unit and the charge/discharge current acquired by the current acquisition unit; and a prohibition unit configured to prohibit the estimation of the parameter performed by the estimation unit, on the basis of the charge/discharge current acquired by the current acquisition unit or the voltage acquired by the voltage acquisition unit.

A parameter estimation method according to an aspect of the present disclosure is for estimating a parameter of an equivalent circuit model of a secondary battery. The parameter estimation method includes the steps of: acquiring a voltage of the secondary battery in a time-series manner; acquiring a charge/discharge current of the secondary battery in a time-series manner; estimating the parameter on the basis of the acquired voltage and the acquired charge/discharge current; and prohibiting the estimating of the parameter on the basis of the acquired charge/discharge current or the acquired voltage.

A computer program according to an aspect of the present disclosure is configured to cause a computer to estimate a parameter of an equivalent circuit model of a secondary battery. The computer program causes the computer to perform the steps of: acquiring a voltage of the secondary battery in a time-series manner; acquiring a charge/discharge current of the secondary battery in a time-series manner; estimating the parameter on the basis of the acquired voltage and the acquired charge/discharge current; and prohibiting the estimating of the parameter on the basis of the acquired charge/discharge current or the acquired voltage.

The present application can be realized as a parameter estimation device including such a characteristic processing unit, can be realized as a parameter estimation method having the steps of such a characteristic process, and can be realized as a computer program for causing a computer to execute such steps. In addition, a part or the entirety of the parameter estimation device can be realized as a semiconductor integrated circuit. The present application can also be realized as a system that includes the parameter estimation device.

DESCRIPTION OF EMBODIMENTS

Figure 1:
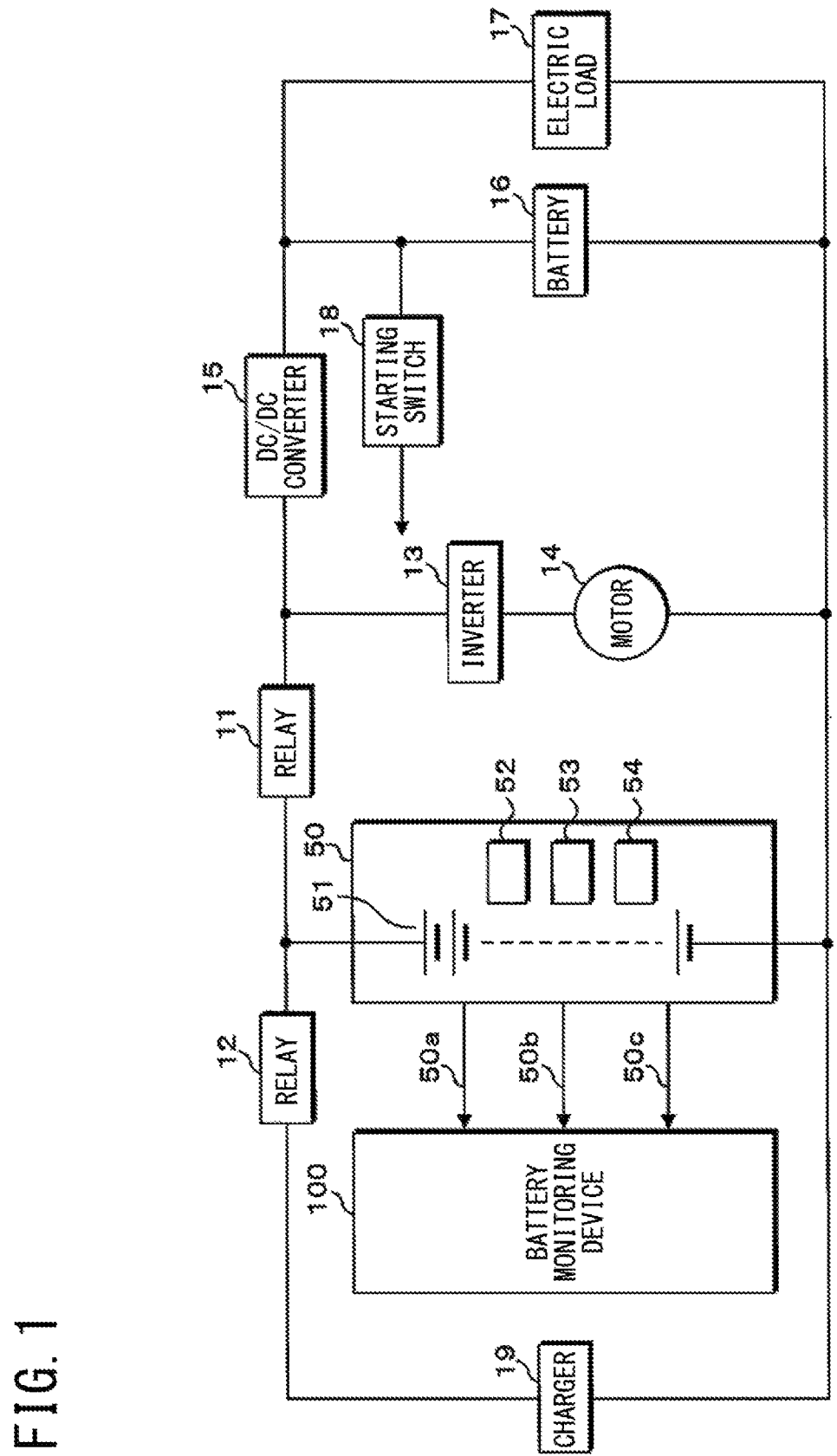
FIG. 1 is a block diagram showing an example of a configuration of a main part of a vehicle equipped with a battery monitoring device according to Embodiment 1.

Problems to be Solved by the Present Disclosure

However, PATENT LITERATURE 1 does not indicate, at least, any actual calculation formula for calculating parameters of the battery equivalent circuit model. A simulation result indicates a tendency in which the estimated value of an internal resistance R0 is greatly deviated in a period of charging and in a period while discharging is stopped after the charging has ended. Meanwhile, according to the technology described in PATENT LITERATURE 2, the time constant $\tau$ and the correction factors $\lambda H$, $\lambda c$ need to be experimentally obtained, and in actuality, variation in batteries and the state of health also need to be taken into consideration. This requires very complicated operation. Further, according to the technology described in PATENT LITERATURE 3, when the current i is zero, the above-described relational expression is not established, and when the current i is constant, the internal impedance cannot be accurately estimated.

The present disclosure has been made in consideration of such circumstances. An object of the present disclosure is to provide a parameter estimation device, a parameter estimation method, and a computer program that can highly accurately estimate internal parameters of a secondary battery, irrespective of a charge/discharge current or a voltage of the secondary battery.

Effects of the Present Disclosure

According to the disclosure of the present application, internal parameters of a secondary battery can be highly accurately estimated, irrespective of a charge/discharge current or a voltage of the secondary battery.

DESCRIPTION OF EMBODIMENT OF THE PRESENT DISCLOSURE

First, embodiments of the present disclosure are listed and described below. At least some parts of the embodiments described below can be combined as desired.

(1) A parameter estimation device according to an aspect of the present disclosure is configured to estimate a parameter of an equivalent circuit model of a secondary battery. The parameter estimation device includes: a voltage acquisition unit configured to acquire a voltage of the secondary battery in a time-series manner; a current acquisition unit configured to acquire a charge/discharge current of the secondary battery in a time-series manner; an estimation unit configured to estimate the parameter on the basis of the voltage acquired by the voltage acquisition unit and the charge/discharge current acquired by the current acquisition unit; and a prohibition unit configured to prohibit the estimation of the parameter performed by the estimation unit, on the basis of the charge/discharge current acquired by the current acquisition unit or the voltage acquired by the voltage acquisition unit.

(9) A parameter estimation method according to an aspect of the present disclosure is for estimating a parameter of an equivalent circuit model of a secondary battery. The parameter estimation method includes the steps of: acquiring a voltage of the secondary battery in a time-series manner; acquiring a charge/discharge current of the secondary battery in a time-series manner; estimating the parameter on the basis of the acquired voltage and the acquired charge/discharge current; and prohibiting the estimating of the parameter on the basis of the acquired charge/discharge current or the acquired voltage.

(10) A computer program according to an aspect of the present disclosure is configured to cause a computer to estimate a parameter of an equivalent circuit model of a secondary battery. The computer program causes the computer to perform the steps of: acquiring a voltage of the secondary battery in a time-series manner; acquiring a charge/discharge current of the secondary battery in a time-series manner; estimating the parameter on the basis of the acquired voltage and the acquired charge/discharge current; and prohibiting the estimating of the parameter on the basis of the acquired charge/discharge current or the acquired voltage.

According to the present aspects, when the charge/discharge current or the voltage of the secondary battery satisfies a predetermined condition while the parameters of the secondary battery are estimated on the basis of the voltage and the charge/discharge current of the secondary battery, parameter estimation is not performed. Accordingly, when there is a high probability that the parameter estimation error is increased, parameter update is postponed.

(2) Preferably, the prohibition unit prohibits the estimation of the parameter when an absolute value of the charge/discharge current is smaller than a first threshold.

According to the present aspect, when the absolute value of the charge/discharge current is smaller than the first threshold, parameter estimation is not performed. Therefore, when the parameter estimation error is inevitably increased, parameter update is postponed.

(3) Preferably, the parameter estimation device further includes: a storage unit configured to store therein the charge/discharge current acquired by the current acquisition unit; and a first calculation unit configured to calculate a difference between the charge/discharge current acquired by the current acquisition unit and the charge/discharge current stored in the storage unit, and the prohibition unit prohibits the estimation of the parameter when the difference calculated by the first calculation unit is smaller than a second threshold.

According to the present aspect, every time a charge/discharge current is acquired, the charge/discharge current is stored, and when the difference between the latest acquired charge/discharge current and the stored charge/discharge current is smaller than the second threshold, parameter estimation is not performed. Therefore, when the parameter estimation error is inevitably increased, parameter update is postponed.

(4) Preferably, the parameter estimation device further includes: a storage unit configured to store therein the voltage acquired by the voltage acquisition unit; and a second calculation unit configured to calculate a difference between the voltage acquired by the voltage acquisition unit and the voltage stored in the storage unit, and the prohibition unit prohibits the estimation of the parameter when the difference calculated by the second calculation unit is smaller than a third threshold.

According to the present aspect, every time a voltage of the secondary battery is acquired, the voltage is stored, and when the difference between the latest acquired voltage and the stored voltage is smaller than the third threshold, parameter estimation is not performed. Accordingly, when the parameter estimation error is inevitably increased, parameter update is postponed.

(5) Preferably, the storage unit further stores therein the voltage acquired by the voltage acquisition unit, the parameter estimation device further comprises a second calculation unit configured to calculate a difference between the voltage acquired by the voltage acquisition unit and the voltage stored in the storage unit, and the prohibition unit prohibits the estimation of the parameter when the difference calculated by the first calculation unit is smaller than the second threshold and the difference calculated by the second calculation unit is smaller than a third threshold.

According to the present aspect, every time a voltage of the secondary battery is acquired, the voltage is also stored, and when the difference between the latest acquired charge/discharge current and the stored charge/discharge current is smaller than the second threshold and the difference between the latest acquired voltage and the stored voltage is smaller than the third threshold, parameter estimation is not performed. Accordingly, when the parameter estimation error is inevitably increased, parameter update is postponed.

(6) Preferably, the equivalent circuit model is represented by a combination of a resistor and a capacitor.

According to the present aspect, the equivalent circuit model of the secondary battery is represented by a combination of a resistor and a capacitor. For example, a Foster type RC equivalent circuit, a Cowell type RC ladder circuit, or the like is applied.

(7) Preferably, the estimation unit estimates the parameter according to a recursive least squares method.

According to the present aspect, using a least squares method by sequentially applying the voltage and the charge/discharge current acquired in a time-series manner to a relational expression representing the relationship between the voltage and the charge/discharge current of the secondary battery, the coefficients of the above relational expression are determined, and the parameters are estimated on the basis of the determined coefficients. Accordingly, the parameters of the secondary battery can be estimated in a time-series manner.

(8) Preferably, the estimation unit estimates the parameter by using a Kalman filter.

According to the present aspect, since a state vector of the equivalent circuit model of the secondary battery and an observation vector of the secondary battery are compared with each other in a time-series manner, to sequentially correct the equivalent circuit model, the parameters of the equivalent circuit model are estimated in a time-series manner.

Details of Embodiment of the Present Disclosure

Hereinafter, given is a detailed description of a specific example in which a parameter estimation device, a parameter estimation method, and a computer program according to an embodiment of the present disclosure are applied to a battery monitoring device that is mounted to a vehicle together with a secondary battery and that monitors the state of the secondary battery. The present disclosure is not limited to these examples but is defined by the claims, and is intended to include meaning equivalent to the scope of the claims and all modifications within the scope. The technological features described in embodiments can be combined with each other.

Embodiment 1

FIG. 1 is a block diagram showing an example of a configuration of a main part of a vehicle equipped with a battery monitoring device 100 according to Embodiment 1. In addition to the battery monitoring device 100, the vehicle includes a secondary battery unit 50, relays 11, 12, an inverter 13, a motor 14, a DC/DC converter 15, a battery 16, an electric load 17, a starting switch 18, and a charger 19.

The relay 11 is connected between the positive electrode side of the secondary battery unit 50, and the input side of the inverter 13 and the input side of the DC/DC converter 15. The output side of the inverter 13 is connected to one end of the motor 14. The output side of the DC/DC converter 15 is connected to, on the positive electrode side of the battery 16, one end of the electric load 17 and one end of the starting switch 18. The relay 12 is connected between the positive electrode side of the secondary battery unit 50 and the positive electrode side of the charger 19. The negative electrode side of the secondary battery unit 50, the other end of the motor 14, the negative electrode side of the battery 16, the other end of the electric load 17, and the negative electrode side of the charger 19 are connected to a common electric potential.

On/Off of the relays 11 and 12 is performed by a relay control unit (not shown). The inverter 13 controls current application to the motor 14 while the relay 11 is on, on the basis of a command from a vehicle controller (not shown). The charger 19 receives power from a power supply outside the vehicle while the vehicle is stopped, and charges the secondary battery unit 50 while the relay 12 is on.

The battery 16 is, for example, a 12 V lead storage battery, supplies power to the electric load 17, and is charged by the DC/DC converter 15, which is supplied with power from the secondary battery unit 50 while the relay 11 is on. As for the battery 16, the voltage is not limited to 12 V, and the type of the battery is not limited to a lead storage battery.

As for the secondary battery unit 50, a plurality of cells 51, which are, for example, lithium ion batteries, are connected in series or in series-parallel and housed in a housing.

The secondary battery unit 50 further includes a voltage sensor 52, a current sensor 53, and a temperature sensor 54 in the housing.

The voltage sensor 52 detects the voltage of each cell 51 and the voltage between both ends of the secondary battery unit 50, and outputs the detected voltages via a voltage detection line 50a to the battery monitoring device 100. The current sensor 53 is composed of, for example, a shunt resistor or a Hall sensor, detects the charge current and the discharge current (hereinafter, referred to as charge/discharge current) of the secondary battery unit 50, and outputs the detected charge/discharge current via a current detection line 50b to the battery monitoring device 100. The temperature sensor 54 is composed of, for example, a thermistor, detects the surface temperature at one or more positions in the plurality of cells 51, and outputs the detected temperature via a temperature detection line 50c to the battery monitoring device 100.

Figure 2:
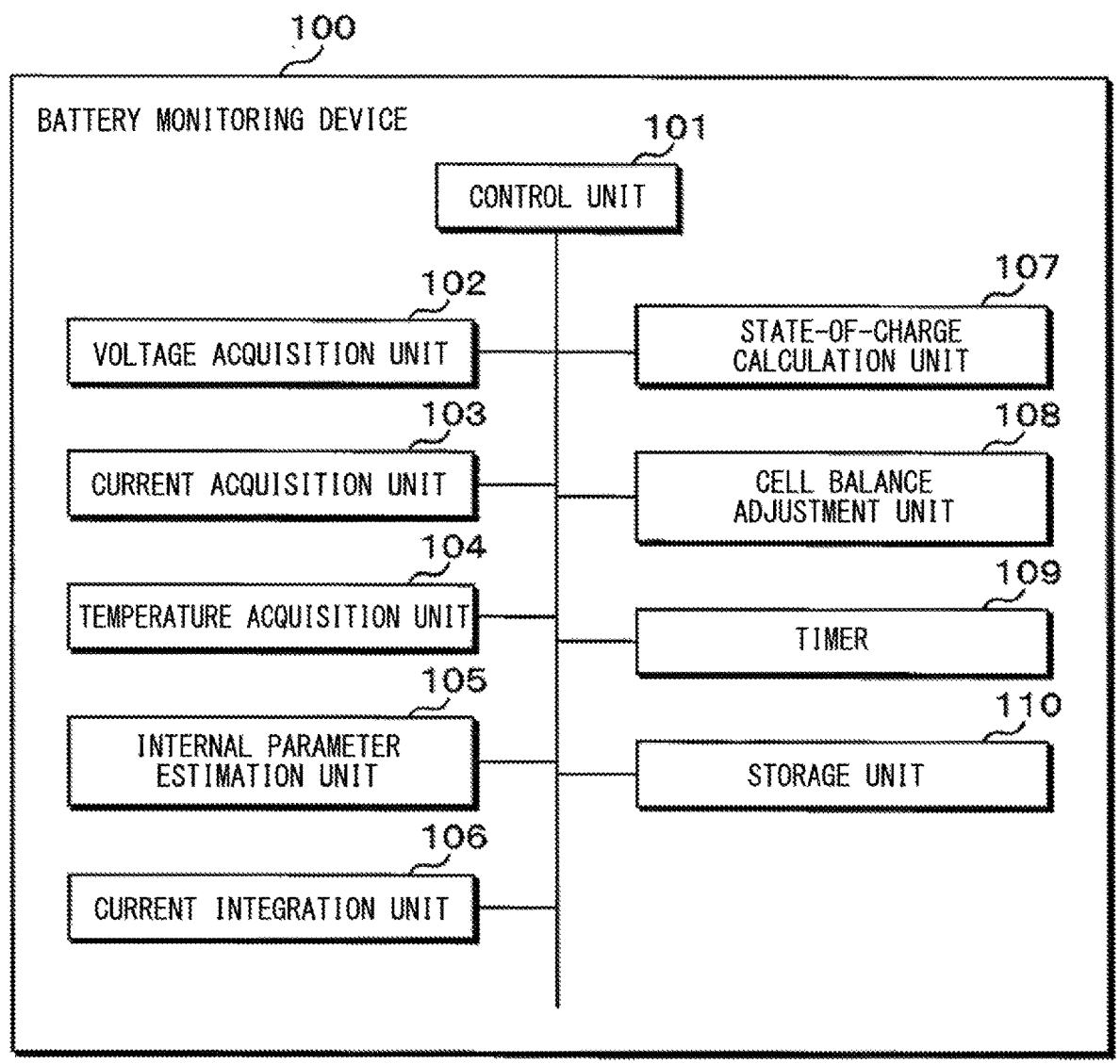
FIG. 2 is a block diagram showing an example of a functional configuration of the battery monitoring device.

FIG. 2 is a block diagram showing an example of a functional configuration of the battery monitoring device 100. A control unit 101 including a CPU (Central Processing Unit) controls the entirety of the battery monitoring device 100. The control unit 101 has connected thereto: a timer 109 which counts time; and a storage unit 110 using a nonvolatile memory such as a flash memory, an EPROM (Erasable Programmable Read Only Memory), or an EEPROM (Electrically EPROM: registered trade mark), and a rewritable memory such as a DRAM (Dynamic Random Access Memory) or an SRAM (Static Random Access Memory).

In addition, the control unit 101 has connected thereto: a voltage acquisition unit 102 which acquires a voltage detected by the voltage sensor 52; a current acquisition unit 103 which acquires a current detected by the current sensor 53; a temperature acquisition unit 104 which acquires a temperature detected by the temperature sensor 54; and a cell balance adjustment unit 108 which adjusts the balance between the state of charge and the voltage of each cell 51. The functions of the voltage acquisition unit 102, the current acquisition unit 103, the temperature acquisition unit 104, and the cell balance adjustment unit 108 are realized by software processing executed by the control unit 101 using hardware. A part or all of these functions may be realized by an integrated circuit including a microcomputer. The frequency of acquisition of a voltage and a current controlled by the control unit 101 is 10 ms, for example, but is not limited thereto. The temperature is acquired at appropriate time.

The functions realized by software processing executed by the control unit 101 further include an internal parameter estimation unit 105, a current integration unit 106, and a state-of-charge calculation unit 107. The software (program) that should be executed by the control unit 101 is stored in advance in the nonvolatile memory of the storage unit 110. Information generated through software processing executed by the control unit 101 is temporarily stored in the rewritable memory of the storage unit 110. A computer program defining the procedure of each software processing performed by the control unit 101 may be loaded in advance in the storage unit 110 by using means (not shown), and the control unit 101 may execute the computer program.

The internal parameter estimation unit 105 estimates values of the resistor and the capacitor (hereinafter, these values of the resistor and the capacitor will be referred to as internal parameters or simply as parameters) representing an equivalent circuit model of the secondary battery unit 50. These internal parameters vary due to the state of charge (SOC), the temperature, and the state of health of the secondary battery unit 50, and can be sequentially estimated by observing the voltage and the charge/discharge current of the secondary battery unit 50. The details will be described later.

The current integration unit 106 integrates the charge/discharge current acquired by the current acquisition unit 103. The integrated value of the current is obtained by integrating the current over time, and corresponds to an amount of change in the charge amount. The timing when integration is started is the timing when the secondary battery unit 50 or the battery monitoring device 100 itself is started, and the current integration unit 106 continuously calculates an integrated value. The integrated value may be reset at a predetermined timing.

The state-of-charge calculation unit 107 calculates a state of charge at the present time point on the basis of the integrated value calculated by the current integration unit 106 and a full charge capacity (FCC) of the secondary battery unit 50. The state of charge is expressed as a ratio of the charge amount to the full charge capacity. When the initial value of the state of charge is defined as SOCin, the state of charge at the present time point is calculated by adding, to SOCin, a value obtained by converting, into a state of charge, an integrated value calculated by the current integration unit 106 during a time period from when SOCin has been calculated to the present time point.

Figure 3A:
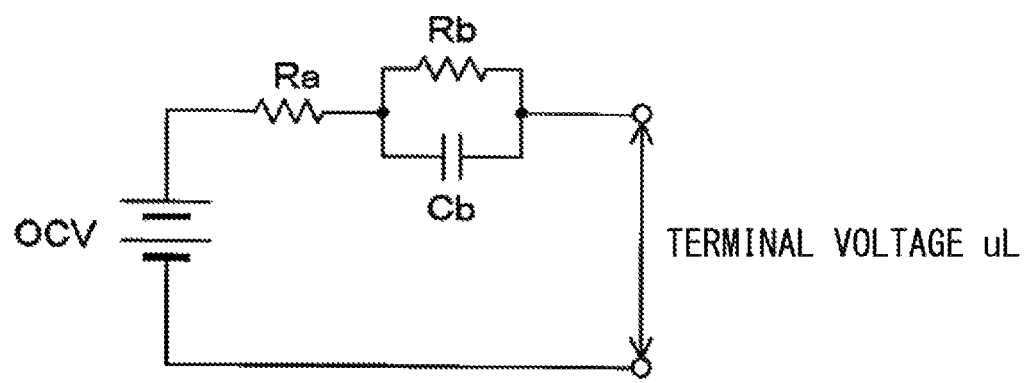
FIG. 3A illustrates an equivalent circuit model of a secondary battery represented by a combination of resistors and a capacitor.
Figure 3B:
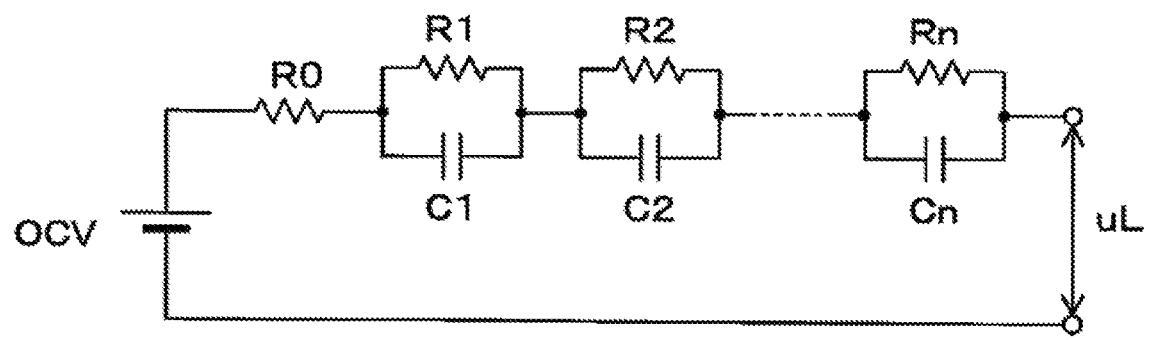
FIG. 3B illustrates an equivalent circuit model of the secondary battery represented by a combination of resistors and capacitors.
Figure 3C:
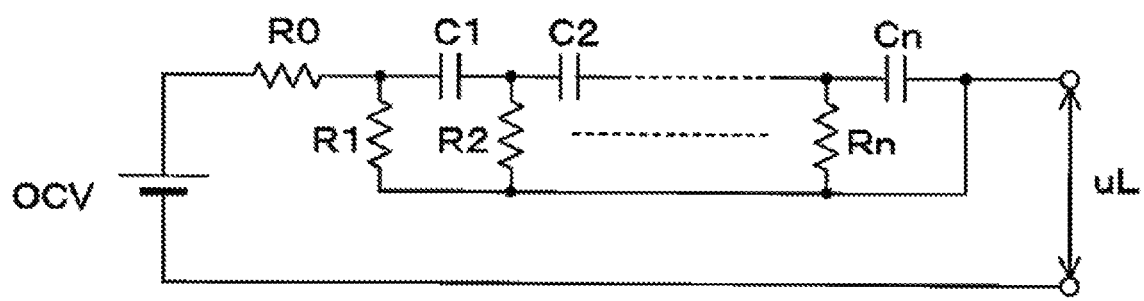
FIG. 3C illustrates an equivalent circuit model of the secondary battery represented by a combination of resistors and capacitors.

Next, the equivalent circuit model of the secondary battery is described. FIG. 3A, FIG. 3B, and FIG. 3C each illustrate an equivalent circuit model of the secondary battery represented by a combination of resistors and capacitors. FIG. 3A is an equivalent circuit model of the secondary battery unit 50 according to the present embodiment. This equivalent circuit model is represented by a circuit in which a resistor Ra and a parallel circuit of a resistor Rb and a capacitor Cb are connected in series to a voltage source having OCV as an electromotive force. The resistor Ra corresponds to electrolyte resistance. The resistor Rb corresponds to charge transfer resistance, and the capacitor Cb corresponds to electric double layer capacitance. The resistor Ra may include charge transfer resistance, and the resistor Rb may correspond to diffusion resistance.

The equivalent circuit model of the secondary battery is not limited to the model shown in FIG. 3A. For example, the equivalent circuit model of the secondary battery may be an n-th order (n is a natural number) Foster type RC ladder circuit represented by approximation with the sum of infinite series, in which n parallel circuits of a resistor Rj and a capacitor Cj (j=1, 2, . . . , n) are connected in series to a resistor R0 as shown in FIG. 3B, or may be an n-th order Cowell type RC ladder circuit in which ends of n resistors Rj (j=1, 2, . . . , n) are connected to each other and the other ends of the n resistors Rj are connected between n capacitors Cj connected in series as shown in FIG. 3C.

When the starting switch 18 is on, or when charging is being performed by the charger 19 during stop of the vehicle, the battery monitoring device 100 described above operates in a normal mode, acquires a voltage and a charge/discharge current of the secondary battery unit 50 every 10 ms, for example, and acquires, at appropriate time, a temperature of the secondary battery unit 50. Meanwhile, when the starting switch 18 is not on, and when charging by the charger 19 is not being performed during stop of the vehicle, the battery monitoring device 100 operates in a low power consumption mode, starts every constant time period, and acquires a voltage, a charge/discharge current, and a temperature of the secondary battery unit 50, as in the case of the normal mode.

On the basis of the acquired voltage, charge/discharge current, and temperature, the battery monitoring device 100 estimates parameters of the equivalent circuit model, and calculates a state of charge. When the initial value SOCin of the state of charge has not been obtained, a voltage acquired immediately after the starting switch 18 has been turned on, or a voltage acquired when the starting switch 18 is not on and charging by the charger 19 is not performed, may be used as an open-circuit voltage (OCV), to calculate SOCin. Specifically, with reference to a conversion table in which OCV-SOC characteristics unique to the secondary battery unit 50 are stored, SOC corresponding to the acquired voltage is used as SOCin. When charging by the charger 19 has been completed and the secondary battery unit 50 is in a fully charged state, SOCin may be set as 100%.

Next, a method for estimating parameters of the equivalent circuit model performed by the internal parameter estimation unit 105 is described. With respect to the parameters of the equivalent circuit model shown in FIG. 3A, it is known that the following approximate equations (1) to (4) are established (for the details, see "Battery Management System Engineering", Shuichi Adachi et al., Tokyo Denki University Press, Chapter 6.2.2).

$$uL(k)=b0 \cdot i(k)+b1 \cdot i(k-1)-a1 \cdot uL(k-1)+(1+a1) \cdot OCV \quad (1)$$

$$b0=Ra \quad (2)$$

$$b1=TsRa/(RbCb)+Ts/Cb-Ra \quad (3)$$

$$a1=Ts/(RbCb)-1 \quad (4)$$

where
uL: acquired voltage,
i: acquired charge/discharge current, and
Ts: cycle for acquiring.

When the parameters Ra, Rb, and Cb are back-calculated from the above equations (2) to (4), the following equations (5) to (7) are established.

$$Ra=b0 \quad (5)$$

$$Rb=(b1-a1b0)/(1+a1) \quad (6)$$

$$Cb=Ts/(b1-a1b0) \quad (7)$$

In the present embodiment, the recursive least squares method is applied to equation (1) to determine coefficients b0, b1, and a1, and the determined coefficients are substituted into equations (5) to (7) to estimate the parameters Ra, Rb, and Cb. It is assumed that the OCV is constant while each parameter is estimated once. The estimated parameters may be corrected in accordance with the temperature acquired by the temperature acquisition unit 104.

It is also possible to calculate the parameters Ra, Rb, and Cb by using a Kalman filter. Specifically, an observation vector when an input signal represented by a terminal voltage and a charge/discharge current is given to the secondary battery unit 50 and a state vector when the same input signal as described above is given to the equivalent circuit model of the secondary battery unit 50 are compared, the error between these vectors is multiplied by the Kalman gain, and the resultant value is fed back to the equivalent circuit model, whereby correction of the equivalent circuit model is repeated such that the error between both vectors is minimized. Accordingly, the parameters are estimated.

Figure 4:
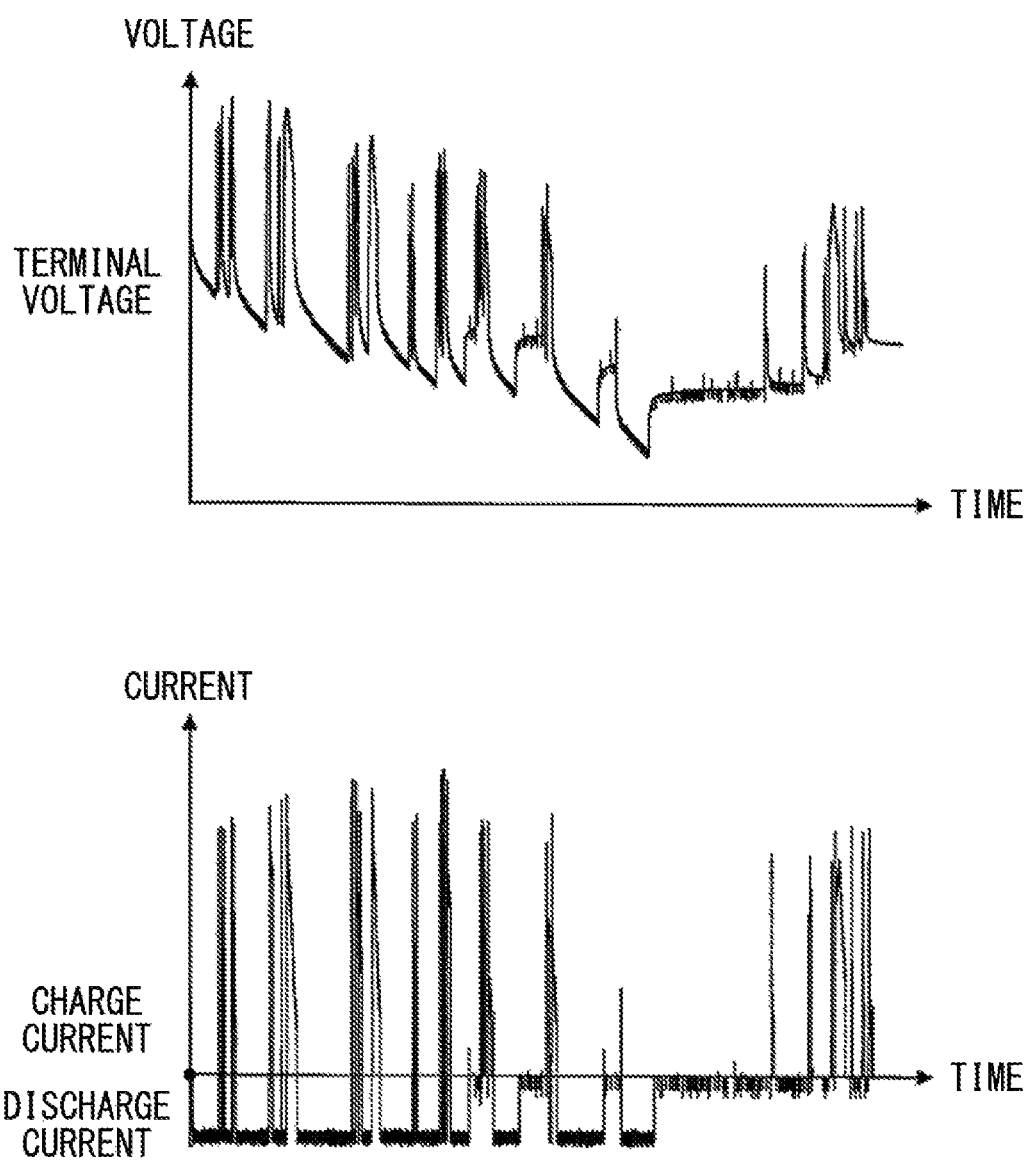
FIG. 4 shows graphs indicating examples of the waveforms of a terminal voltage and a charge/discharge current of the secondary battery unit.

In the following, described is an example of parameters calculated according to a least squares method by acquiring a voltage and a charge/discharge current of the secondary battery unit 50 during travel of the vehicle. FIG. 4 shows graphs indicating examples of the waveforms of the terminal voltage and the charge/discharge current of the secondary battery unit 50. In FIG. 4, the voltage waveform is shown in the upper part, and the current waveform is shown in the lower part. In FIG. 4, the horizontal axis represents time, and the vertical axis represents voltage or current. In the current waveform shown in the lower part of FIG. 4, a positive value of the current means charge current, and a negative value of the current means discharge current. When the voltage waveform shown in the upper part of FIG. 4 is viewed, together with the corresponding charge current and discharge current, it is understood that the voltage of the secondary battery greatly fluctuates in the up-down direction, for each charge/discharge, due to voltage drop caused by the internal resistance.

Figure 5:
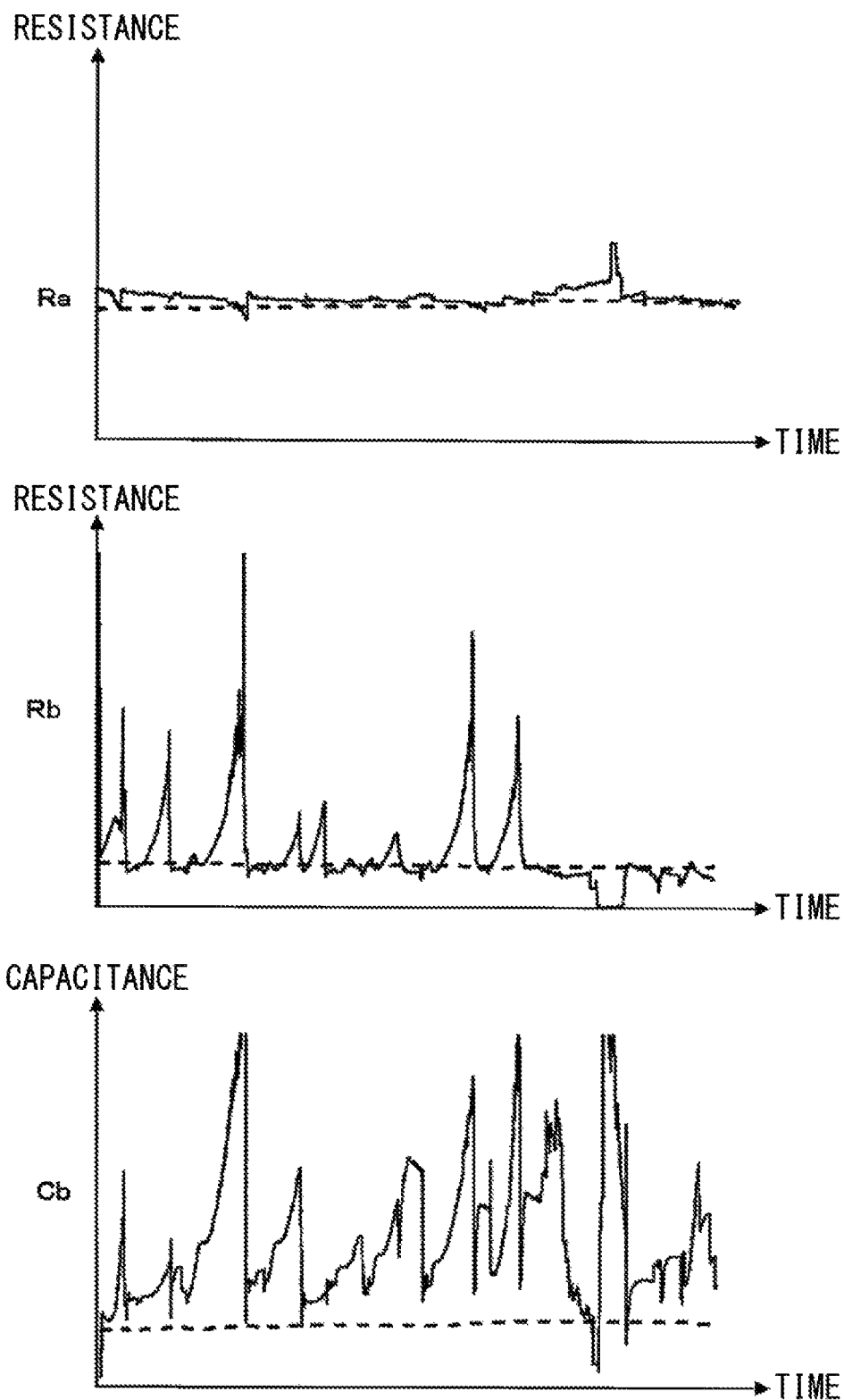
FIG. 5 shows graphs indicating results of sequential estimation of parameters of an equivalent circuit model of the secondary battery unit.

FIG. 5 shows graphs indicating results of sequential estimation of parameters of the equivalent circuit model of the secondary battery unit 50. In the upper part, the middle part, and the lower part of FIG. 5, estimation results of the parameters Ra, Rb, and Cb are indicated by solid lines, respectively. Broken lines in FIG. 5 indicate the magnitudes of the respective parameters actually measured according to a so-called AC impedance method. In FIG. 5, the horizontal axis represents time, and the vertical axis represents resistance or capacitance. The parameter Ra shown in the upper part of FIG. 5 generally matches the actually measured value, whereas the parameters Rb and Cb shown in the middle part and the lower part of FIG. 5 sometimes greatly deviate from the actually measured values.

Figure 6:
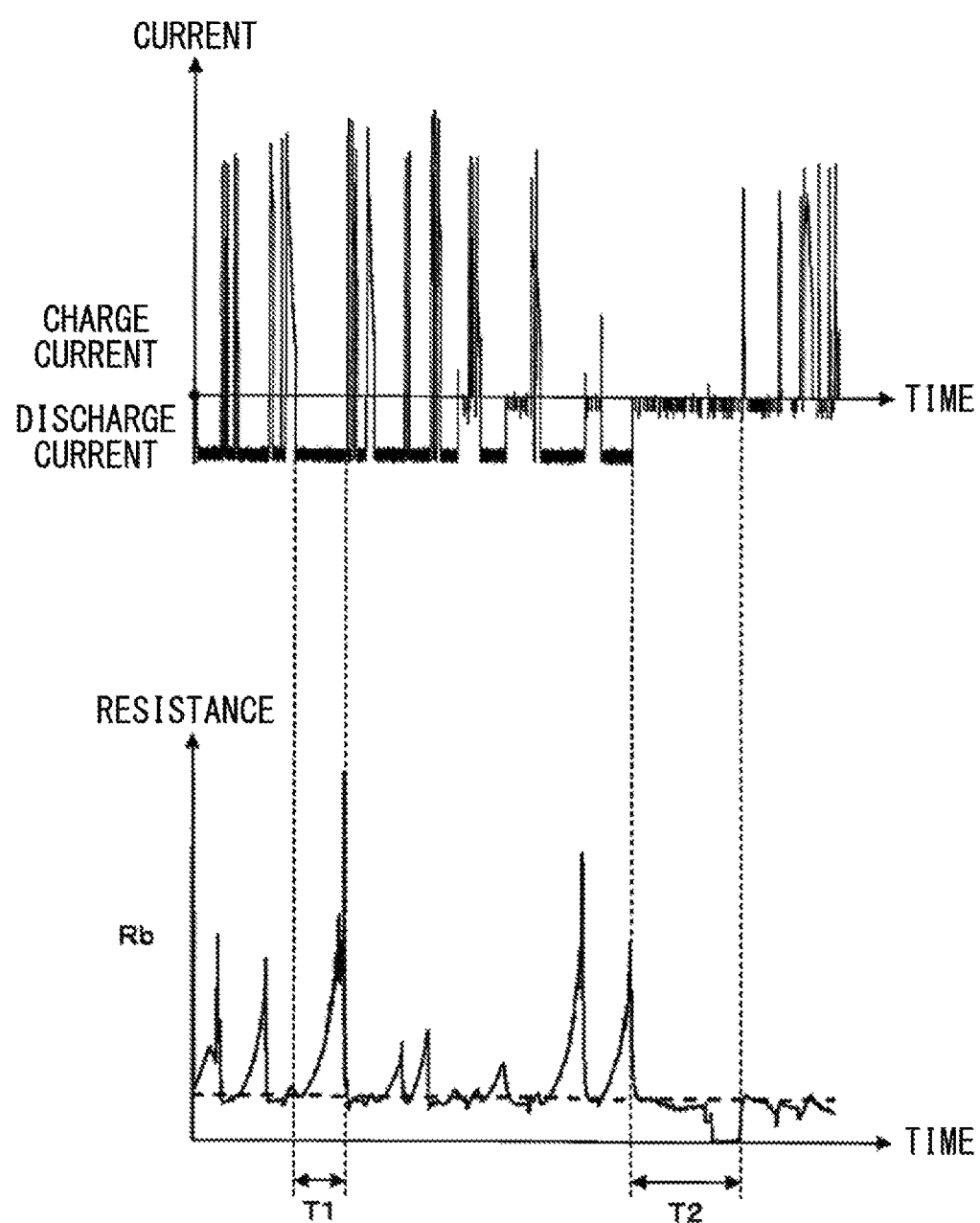
FIG. 6 shows graphs indicating correspondence between the charge/discharge current of the secondary battery unit and a parameter Rb.

The timings at which these deviations occur are examined. FIG. 6 shows graphs indicating correspondence between the charge/discharge current of the secondary battery unit 50 and the parameter Rb. Transition of the charge/discharge current is shown in the upper part of FIG. 6, and transition of the estimated parameter Rb is shown in the lower part of FIG. 6. In FIG. 6, the horizontal axis represents time, and the vertical axis represents current or resistance. As understood from FIG. 6, the period in which the parameter Rb greatly deviates from the actually measured value corresponds to the period in which the magnitude of the charge/discharge current is substantially constant or substantially zero (for example, see sections T1 and T2).

The cause for this deviation is analyzed on the basis of equation (1) and equations (5) to (7). Equation (1) has four unknown quantities (a1, b0, b1, and OCV), and in order to obtain these values, at least four equations are necessary. However, with respect to the acquired charge/discharge current i, when i(k)=i(k−1)=0 is established, the values of the terms regarding b0 and b1 become zero, and the equations (5) to (7) are not established. When i(k)=i(k−1)=constant is established, change in the OCV caused by flowing of the constant current merely appears in uL(k), and the change in uL(k) becomes very small. Therefore, the parameters cannot be accurately estimated.

Figure 7:
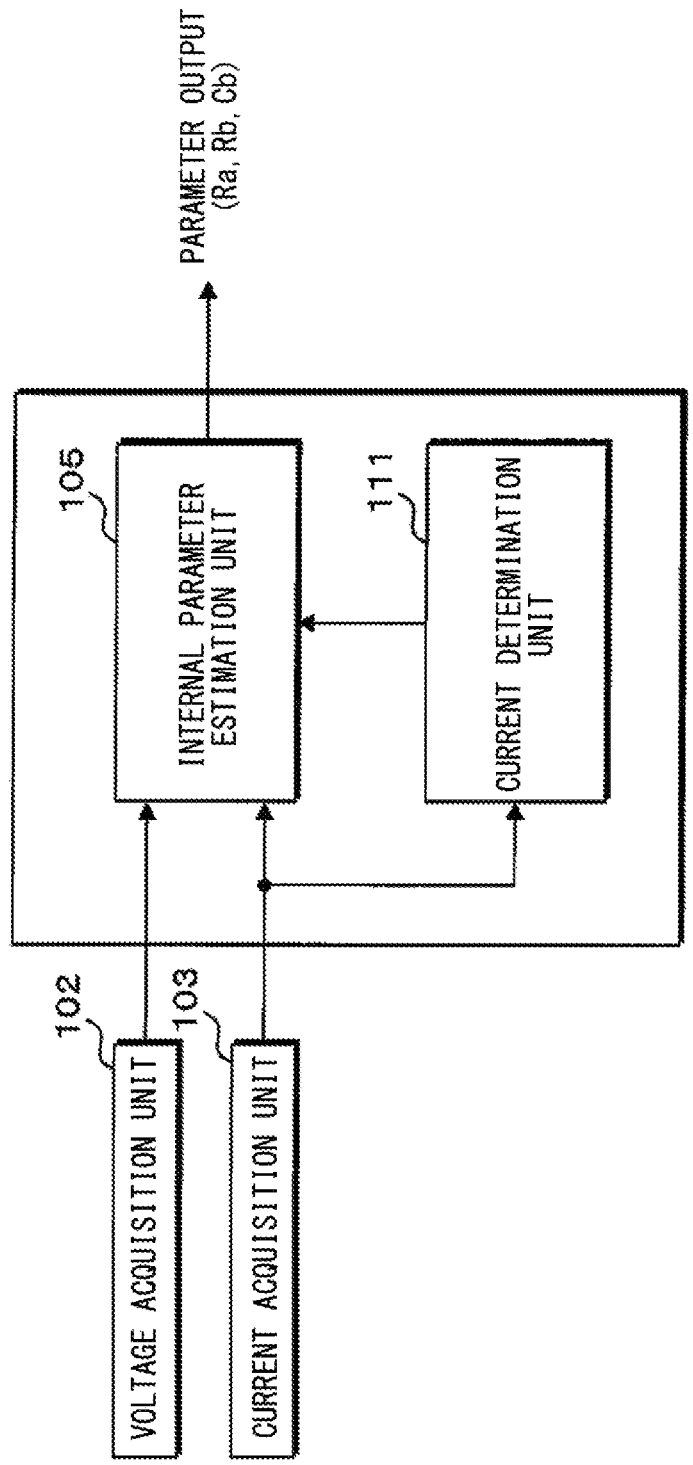
FIG. 7 schematically illustrates a relationship between function blocks related to estimation of the parameters.

Therefore, in the present embodiment, a current determination unit 111 is further added to the function blocks shown in FIG. 2, and when there is a high probability that parameter estimation cannot be appropriately performed, parameter estimation by the internal parameter estimation unit 105 is prohibited. FIG. 7 schematically illustrates a relationship between function blocks related to estimation of the parameters. When parameter estimation is not prohibited by the current determination unit 111, the internal parameter estimation unit 105 outputs the parameters Ra, Rb, Cb as described above, on the basis of the voltage (terminal voltage uL) acquired by the voltage acquisition unit 102 and the charge/discharge current i acquired by the current acquisition unit 103.

When the charge/discharge current i acquired by the current acquisition unit 103 is smaller than a first threshold, and when the amount of change in the charge/discharge current i acquired by the current acquisition unit 103 is smaller than a second threshold, the current determination unit 111 prohibits parameter estimation performed by the internal parameter estimation unit 105. When parameter estimation has been prohibited by the current determination unit 111, the internal parameter estimation unit 105 continues to output the parameters estimated in the immediately preceding time, without updating the parameters.

Figure 8:
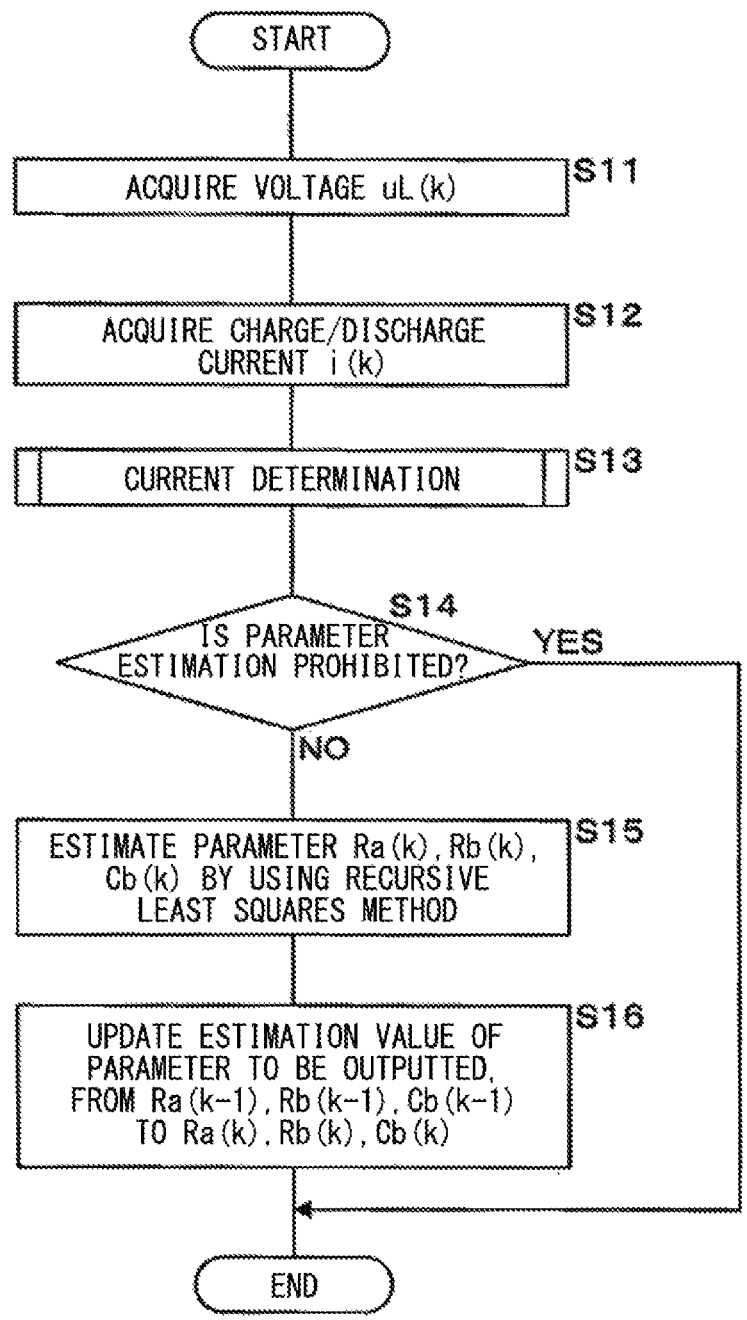
FIG. 8 is a flow chart showing a procedure of a process performed by a control unit for estimating the parameters at appropriate time in the battery monitoring device according to Embodiment 1.
Figure 9:
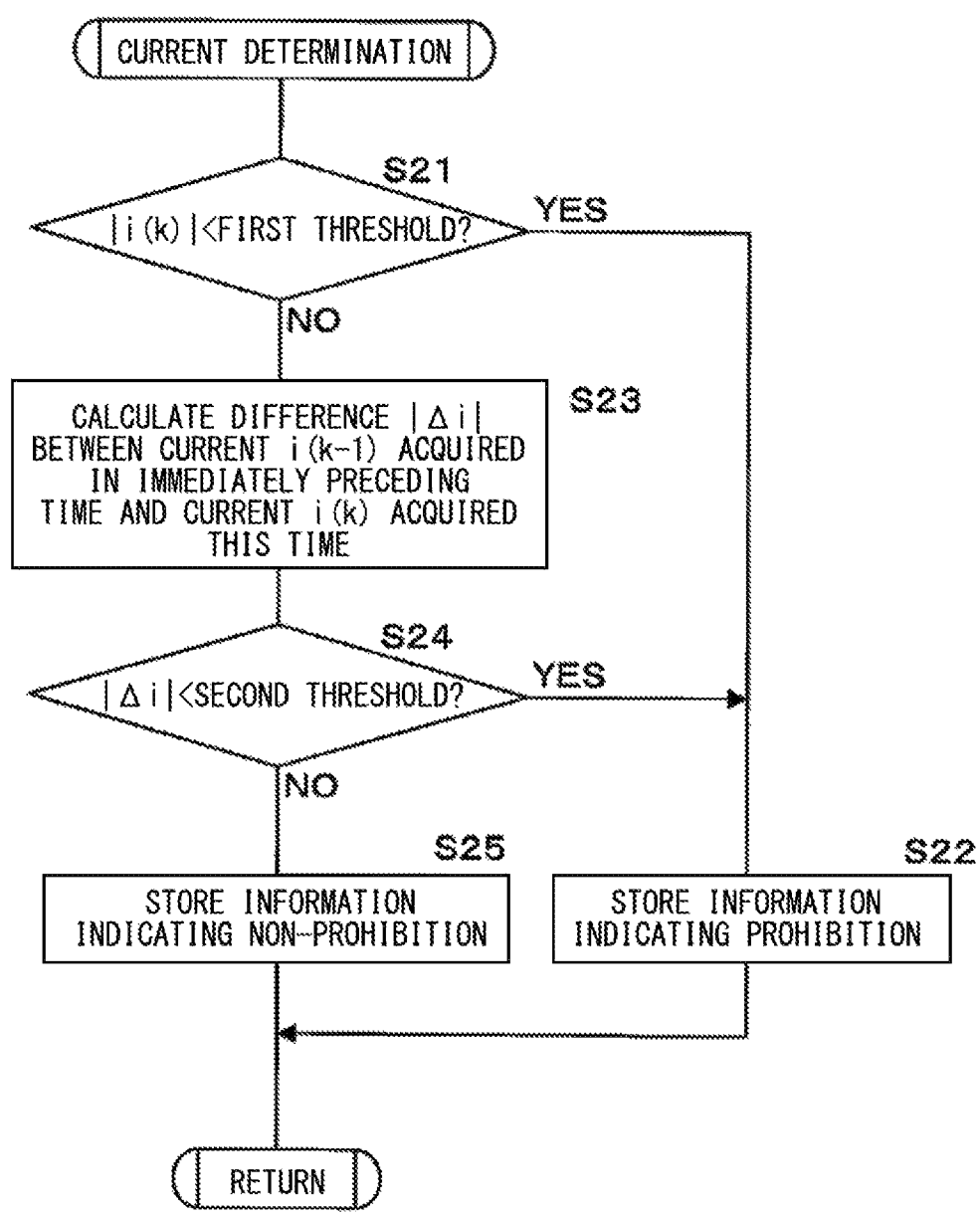
FIG. 9 is a flow chart showing a procedure of a process, performed by the control unit, of a subroutine of current determination in the battery monitoring device according to Embodiment 1.

In the following, operation of the above-described battery monitoring device 100 is described by using a flow chart indicating the operation. FIG. 8 is a flow chart showing a procedure of a process performed by the control unit 101 for estimating the parameters at appropriate time in the battery monitoring device 100 according to Embodiment 1. FIG. 9 is a flow chart showing a procedure of a process, performed by the control unit 101, of a subroutine of current determination. The process shown in FIG. 8 is a main routine, is started every 10 ms, for example, and is cyclically executed. An acquired result and a calculation result in each step are stored in the storage unit 110 as appropriate. In FIG. 8, the terminal voltage is simply referred to as voltage. In FIG. 9, the charge/discharge current is simply referred to as current.

When the main routine in FIG. 8 has been started, the control unit 101 acquires a voltage uL(k) of the secondary battery unit 50 by means of the voltage acquisition unit 102 (S11), and acquires a charge/discharge current i(k) by means of the current acquisition unit 103 (S12). Next, the control unit 101 calls the subroutine regarding current determination (S13).

With reference to FIG. 9, when the subroutine regarding current determination has been called, the control unit 101 determines whether or not |i(k)|, which is the absolute value of the current i(k), is smaller than the first threshold (S21). When |i(k)| is smaller than the first threshold (S21: YES), the control unit 101 stores information indicating that parameter estimation is prohibited (S22), and returns to the main routine. The first threshold may be a fixed value obtained through an experiment or a simulation, or may be a variable value that is changed in accordance with a traveling condition.

When |i(k)| is not smaller than the first threshold (S21: NO), the control unit 101 calculates |Δi|, which is the difference between the current i(k−1) acquired in the immediately preceding time and stored in the storage unit 110, and the current i(k) acquired this time (S23: corresponding to "first calculation unit"). In the present application, the absolute value of the difference is simply referred to as difference. Next, the control unit 101 determines whether or not the calculated |Δi| is smaller than the second threshold (S24). When the |Δi| is smaller than the second threshold (S24: YES), the control unit 101 shifts the process to step S22. Accordingly, information indicating that parameter estimation is prohibited is stored.

When |Δi| is not smaller than the second threshold (S24: NO), the control unit 101 stores information indicating that parameter estimation is not prohibited (S25) and returns to the main routine.

With reference back to FIG. 8, when having returned from the subroutine regarding current determination, the control unit 101 determines whether or not information indicating that parameter estimation is prohibited is stored, i.e., whether or not parameter estimation is prohibited (S14: corresponding to "prohibition unit"). When parameter estimation is prohibited (S14: YES), the control unit 101 does not perform parameter estimation, and ends the execution of the main routine in FIG. 8. As a result, the control unit 101 continues to output the parameters estimated in the immediately preceding time, without updating the parameters.

When parameter estimation is not prohibited (S14: NO), the control unit 101 estimates parameters Ra(k), Rb(k), Cb(k) through equations (1) to (7) by using the recursive least squares method (S15: corresponding to "estimation unit"). Next, the control unit 101 updates the estimated values of the parameters to be outputted, from Ra(k−1), Rb(k−1), Cb(k−1) to Ra(k), Rb(k), Cb(k) (S16), and ends the execution of the main routine.

Figure 10:
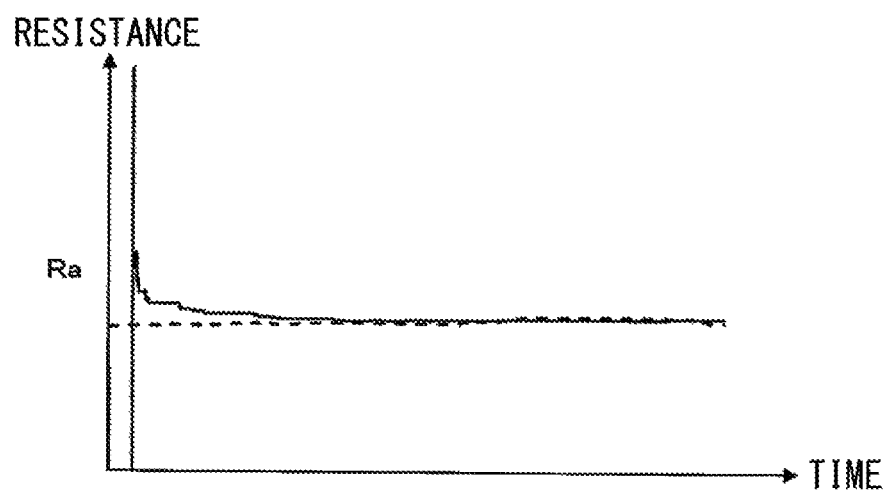
FIG. 10 shows graphs indicating results of estimations, performed at appropriate time, of the parameters of an equivalent circuit model of the secondary battery unit.
Figure 10:
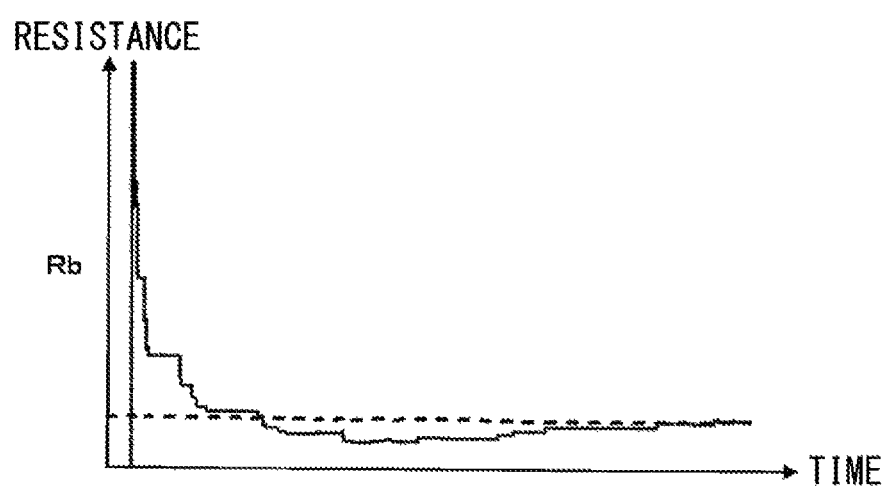
Figure 10:
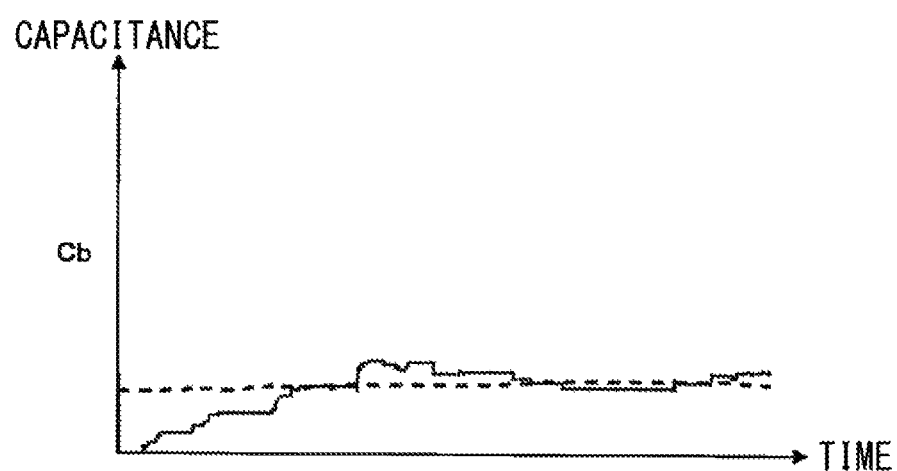

Next, effects of estimating the parameters by the processes shown in FIG. 8 and FIG. 9 are described. FIG. 10 shows graphs indicating results of estimations, performed at appropriate time, of the parameters of the equivalent circuit model of the secondary battery unit 50. Estimation results of the parameters Ra, Rb, and Cb are indicated by solid lines in the upper part, the middle part, and the lower part of FIG. 10, respectively. Broken lines in FIG. 10 indicate the magnitudes of the respective parameters actually measured according to a so-called AC impedance method. In FIG. 10, the horizontal axis represents time and the vertical axis represents resistance or capacitance. With reference to FIG. 10, it is observed that each parameter Ra, Rb, Cb converges toward the actually measured value.

Here, when the least squares method is applied to equation (1) described above, parameter estimation and OCV estimation can be simultaneously performed, and with reference to the OCV-SOC characteristics unique to the secondary battery unit 50, SOC can be further estimated from the estimated OCV. However, in the present embodiment, parameters are estimated only when the acquired charge/discharge current i satisfies a predetermined condition, and thus, OCV and SOC cannot be estimated in some cases.

Figure 11:
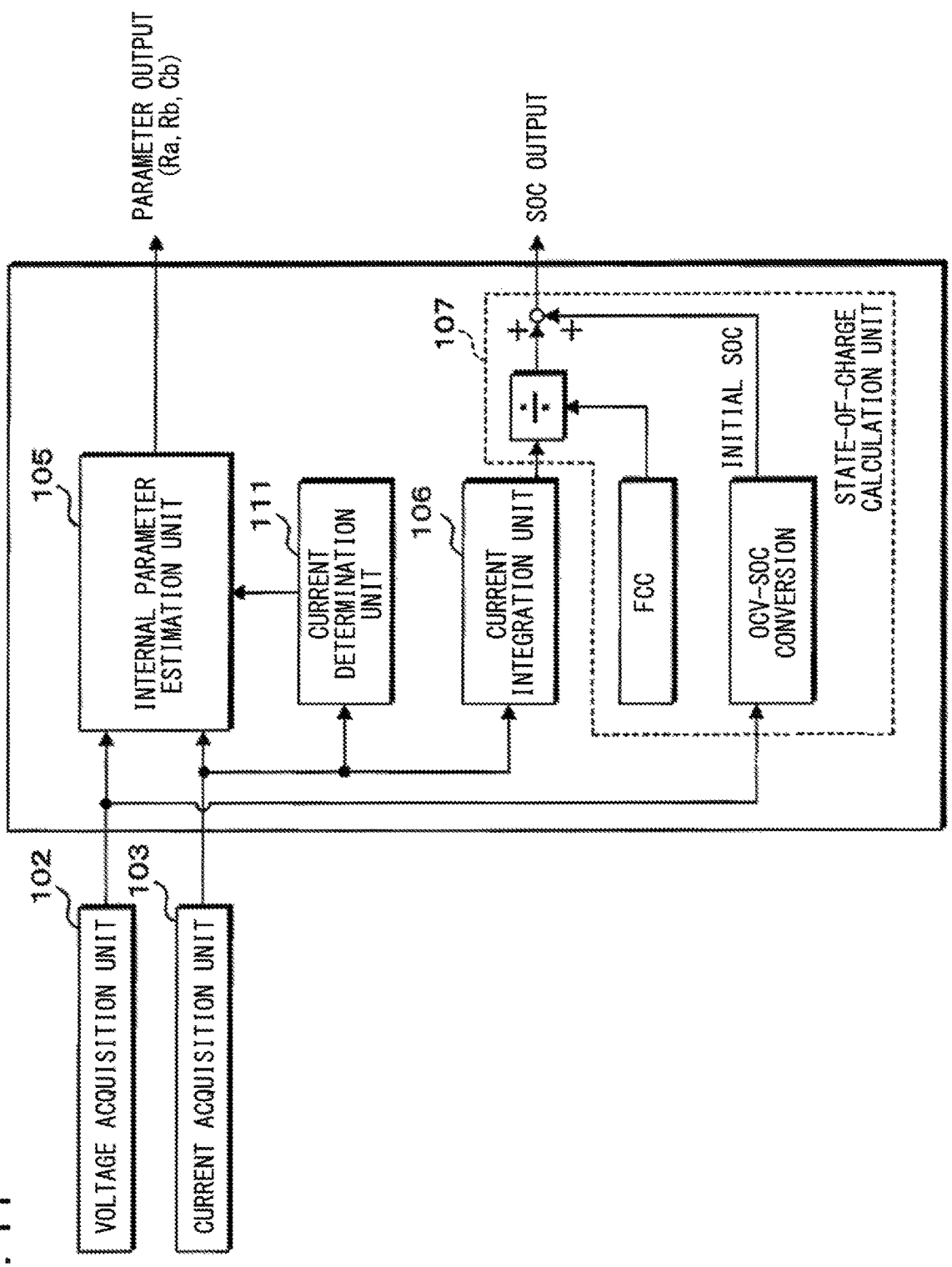
FIG. 11 schematically illustrates a relationship between function blocks related to estimation of the parameters and calculation of the state of charge.

Thus, in the present embodiment, the state of charge is sequentially calculated by the state-of-charge calculation unit 107. FIG. 11 schematically illustrates a relationship between function blocks related to estimation of the parameters and calculation of the state of charge. Since the internal parameter estimation unit 105 and the current determination unit 111 in FIG. 11 are the same as those in FIG. 7, description thereof is omitted. In FIG. 11, the details of the function block of the state-of-charge calculation unit 107 in particular are specifically described.

The current integration unit 106 integrates the charge/discharge current i acquired by the current acquisition unit 103, thereby calculating an amount of change in the charge amount. When the acquisition cycle of the current by the current acquisition unit 103 is defined as Δt (for example, 10 milliseconds), and the current value cyclically acquired is defined as Ibi (i=1, 2, . . . ), the amount of change in the charge amount is calculated as ΣIbi×Δt(i=1, 2, . . . ).

The state-of-charge calculation unit 107 calculates an initial SOC on the basis of, for example, a voltage acquired by the voltage acquisition unit 102 and a conversion table having stored therein OCV-SOC characteristics, and stores the calculated initial SOC as SOCin. Meanwhile, the state-of-charge calculation unit 107 sequentially calculates an amount of change in the state of charge, by dividing the amount of change in the charge amount calculated by the current integration unit 106 by the full charge capacity FCC. An SOCo to be outputted is calculated by adding the amount of change in the state of charge to the stored SOCin, as indicated by equation (8) below. The content in { } of equation (8) corresponds to the amount of change in the state of charge.

$$SOCo = SOCin \pm \{\Sigma Ibi \times \Delta t(i=1,2,\ldots,m)/FCC\} \quad (8)$$

where
signs ±: +(plus) and − (minus) correspond to charging time and discharging time, respectively. numerical value m: the number of integrations of the charge/discharge current from when SOCin has been obtained to the present time point.

Figure 12:
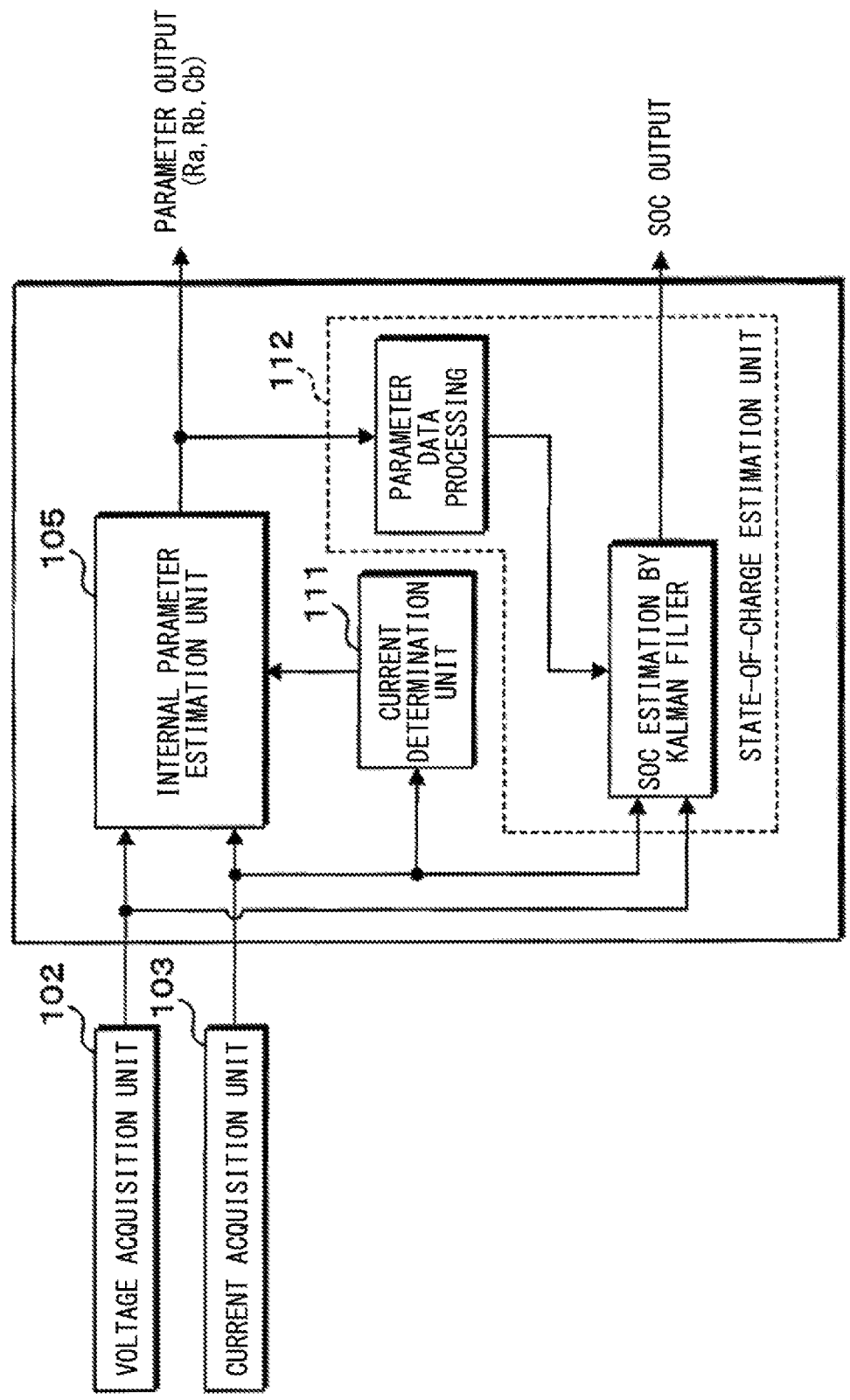
FIG. 12 schematically illustrates a relationship between function blocks related to estimation of the parameters and the state of charge.

In FIG. 11 described above, a case where the state of charge is calculated by the state-of-charge calculation unit 107 has been described. However, the state of charge can also be estimated by using a Kalman filter. FIG. 12 schematically illustrates a relationship between function blocks related to estimation of the parameters and the state of charge. Since the internal parameter estimation unit 105 and the current determination unit 111 in FIG. 12 are the same as those in FIG. 7, description thereof is omitted. A state-of-charge estimation unit 112 estimates SOCo to be outputted, on the basis of the voltage acquired by the voltage acquisition unit 102, the charge/discharge current acquired by the current acquisition unit 103, and the parameters estimated by the internal parameter estimation unit 105.

Specifically, after subjecting the parameters estimated by the internal parameter estimation unit 105 to parameter data processing, the state-of-charge estimation unit 112 generates a state vector indicating the state of the secondary battery unit 50, and generates an observation vector indicating an observation value based on the results acquired by the voltage acquisition unit 102 and the current acquisition unit 103. Then, on the basis of these vectors, the state-of-charge estimation unit 112 updates the state of the secondary battery unit 50 by using a Kalman filter, thereby estimating a state of charge of the secondary battery unit 50. Since estimation of the state of charge using a Kalman filter is described in detail in Japanese Laid-Open Patent Publication No. 2015-224927, detailed description thereof is omitted.

As described above, according to the present embodiment 1, when the charge/discharge current of the secondary battery unit 50 satisfies a predetermined condition while the parameters of the secondary battery unit 50 are estimated on the basis of the voltage and the charge/discharge current of the secondary battery unit 50, parameter estimation is not performed. Accordingly, when there is a high probability that the parameter estimation error is increased, parameter update is postponed. Therefore, irrespective of the magnitude of the charge/discharge current of the secondary battery unit 50, the parameters of the secondary battery unit 50 can be highly accurately estimated.

According to the present embodiment 1, when the absolute value of the charge/discharge current of the secondary battery unit 50 is smaller than the first threshold, parameter estimation is not performed. Therefore, when the parameter estimation error is inevitably increased, parameter update can be postponed.

Further, according to the present embodiment 1, every time a charge/discharge current of the secondary battery unit 50 is acquired, the charge/discharge current is stored in the storage unit 110, and when the difference between the latest acquired charge/discharge current and the stored charge/discharge current is smaller than the second threshold, parameter estimation is not performed. Therefore, when the parameter estimation error is inevitably increased, parameter update can be postponed.

Further, according to the present embodiment 1, the equivalent circuit model of the secondary battery unit 50 is represented by a combination of the resistors Ra, Rb and the capacitor Cb. For example, an n-th order Foster type RC equivalent circuit, an n-th order Cowell type RC ladder circuit, or the like can also be applied.

Further, according to the present embodiment 1, a least squares method is used by sequentially applying the voltage and the charge/discharge current acquired in a time-series manner to equation (1) representing the relationship between the voltage and the charge/discharge current of the secondary battery unit 50, whereby the coefficients b0, b1, and a1 of equation (1) are determined, and the parameters Ra, Rb, and Cb are estimated on the basis of the determined coefficients. Accordingly, the internal parameters of the secondary battery can be estimated in a time-series manner.

Further, according to the present embodiment 1, since a state vector of the equivalent circuit model of the secondary battery unit 50 and an observation vector of the secondary battery unit 50 are compared with each other in a time-series manner, to sequentially correct the equivalent circuit model, the parameters of the equivalent circuit model can be estimated in a time-series manner.

Embodiment 2

Embodiment 1 is in a form in which parameter estimation is prohibited on the basis of the charge/discharge current of the secondary battery unit 50 acquired in a time-series manner, whereas Embodiment 2 is in a form in which parameter estimation is prohibited on the basis of the charge/discharge current and the voltage of the secondary battery unit 50 acquired in a time-series manner. Since the configuration example of the battery monitoring device 100 according to Embodiment 2 is similar to that in Embodiment 1, parts corresponding to those in Embodiment 1 are denoted by the same reference signs, and description thereof is omitted.

Figure 13:
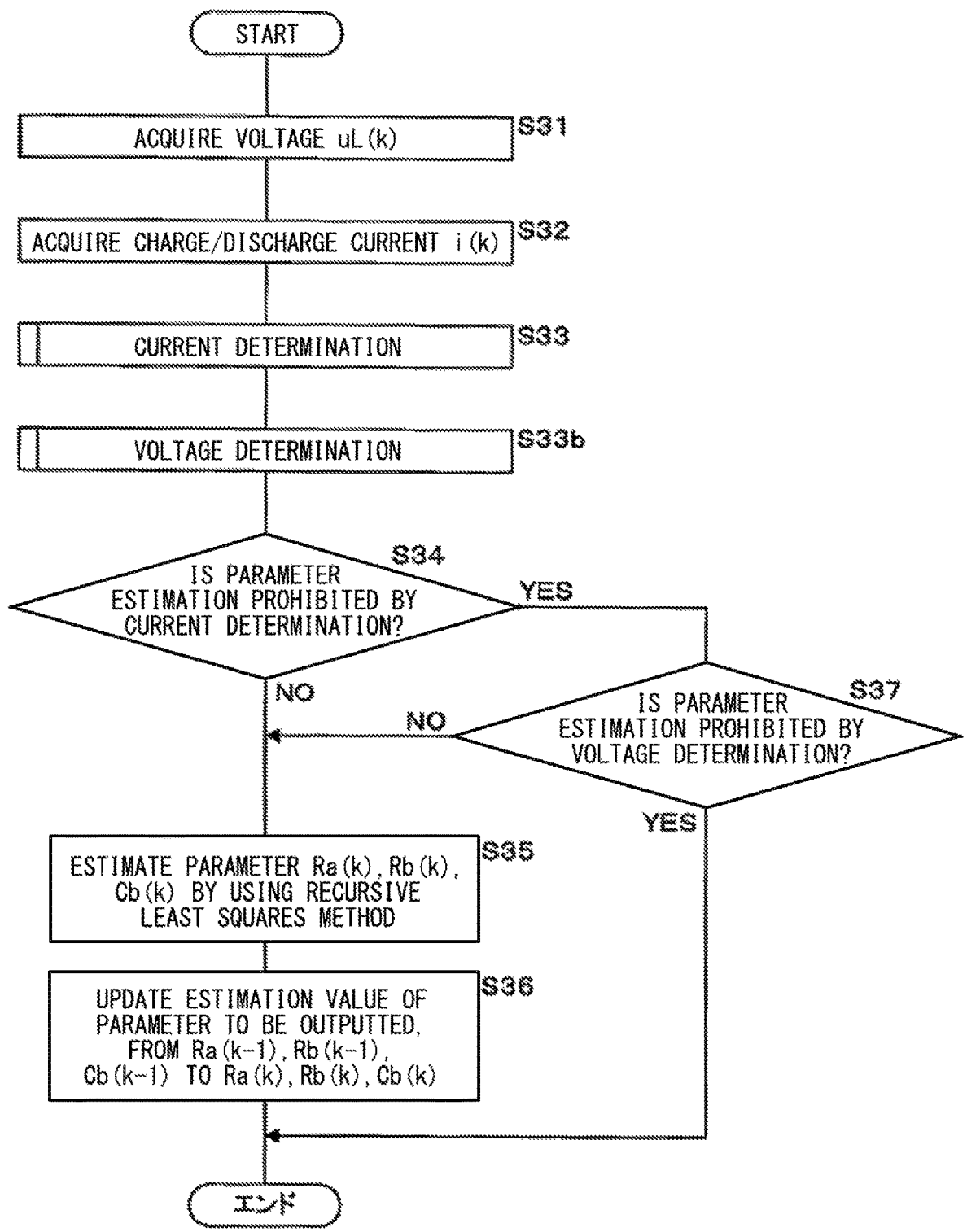
FIG. 13 is a flow chart showing a procedure of a process performed by the control unit for estimating the parameters at appropriate time in the battery monitoring device according to Embodiment 2.
Figure 14:
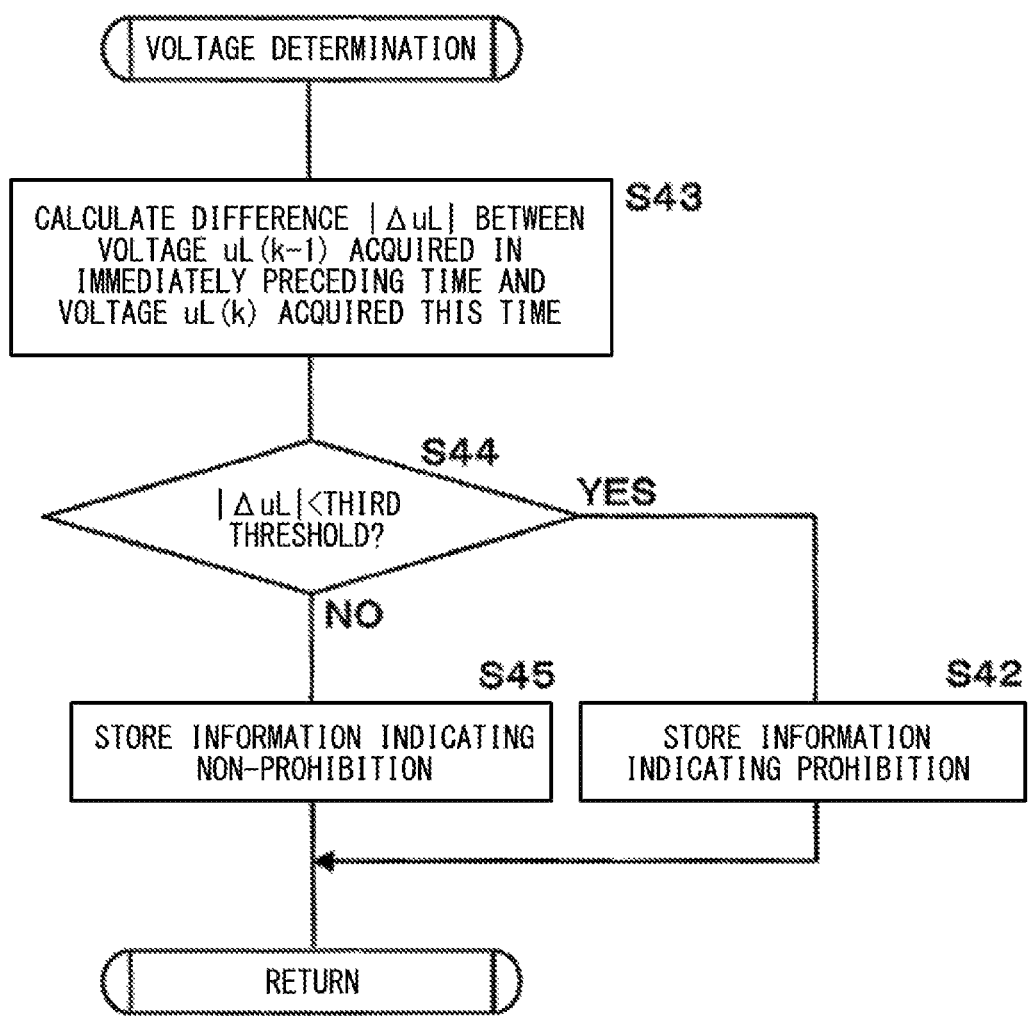
FIG. 14 is a flow chart showing a procedure of a process, performed by the control unit, of a subroutine of voltage determination in the battery monitoring device according to Embodiment 2.

FIG. 13 is a flow chart showing a procedure of a process performed by the control unit 101 for estimating the parameters at appropriate time in the battery monitoring device 100 according to Embodiment 2. FIG. 14 is a flow chart showing a procedure of a process, performed by the control unit 101, of a subroutine of voltage determination. The process shown in FIG. 13 is a main routine, and is cyclically executed. Since the process from steps S31 to S36 except step S33b shown in FIG. 13 is similar to the process from steps S11 to S16 shown in FIG. 8 of Embodiment 1, description of these steps is simplified.

When the main routine in FIG. 13 has been started, the control unit 101 acquires a voltage uL(k) of the secondary battery unit 50 (S31), and further acquires a charge/discharge current i(k) (S32), and then, calls the subroutine related to current determination (S33). Since the subroutine related to current determination is completely the same as that shown in FIG. 9 of Embodiment 1, description thereof is omitted. Next, the control unit 101 calls the subroutine related to voltage determination (S33b).

With reference to FIG. 14, when the subroutine related to voltage determination has been called, the control unit 101 calculates $|\Delta uL|$, which is the difference between a voltage uL(k−1) acquired in the immediately preceding time and stored in the storage unit 110, and the voltage uL(k) acquired this time (S43: corresponding to "second calculation unit"). Next, the control unit 101 determines whether or not the calculated $|\Delta uL|$ is smaller than a third threshold (S44). When the calculated $|\Delta uL|$ is smaller than the third threshold (S44: YES), the control unit 101 stores information indicating parameter estimation is prohibited (S42), and returns to the main routine.

When |ΔuL| is not smaller than the third threshold (S44: NO), the control unit 101 stores information indicating that parameter estimation is not prohibited (S45), and returns to the main routine. The information indicating the prohibition and the information indicating the non-prohibition respectively stored in steps S42 and S45 are stored in a storage region different from that used for the information indicating the prohibition and the information indicating the non-prohibition stored in steps S22 and S25 of the subroutine related to current determination shown in FIG. 9.

With reference back to FIG. 13, when having returned from the subroutine related to voltage determination, the control unit 101 determines whether or not the information indicating that parameter estimation is prohibited as a result of current determination is stored, i.e., whether or not parameter estimation is prohibited (S34: corresponding to "prohibition unit"). When parameter estimation is not prohibited (S34: NO), the control unit 101 estimates parameters Ra(k), Rb(k), Cb(k), by using the recursive least squares method (S35: corresponding to "estimation unit"). Next, the control unit 101 updates the estimated values of the parameters to be outputted, from Ra(k−1), Rb(k−1), Cb(k−1) to Ra(k), Rb(k), Cb(k) (S36), and ends the execution of the main routine.

When parameter estimation is prohibited in step S34 (S34: YES), the control unit 101 further determines whether or not parameter estimation is prohibited as a result of voltage determination (S37: corresponding to "prohibition unit"). When parameter estimation is also prohibited here (S37: YES), the control unit 101 ends the execution of the main routine of FIG. 13 without performing parameter estimation. As a result, the control unit 101 continues to output the parameters estimated in the immediately preceding time, without updating the parameters.

Meanwhile, when parameter estimation is prohibited as a result of current determination, but parameter estimation is not prohibited as a result of voltage determination (S37: NO), the control unit 101 shifts the process to step S35, performs parameter estimation, and ends the execution of the main routine.

In the flow chart of the main routine shown in FIG. 13, both of the subroutine related to current determination and the subroutine related to voltage determination are called. However, determination in step S34 may be skipped without calling the subroutine related to current determination, and the process may be shifted to step S37. In this case, whether or not to perform parameter estimation is determined on the basis of the sequential difference value, of the voltage of the secondary battery unit 50, acquired in a time-series manner.

As described above, according to the present Embodiment 2, when the voltage of the secondary battery unit 50 satisfies a predetermined condition, i.e., every time a voltage of the secondary battery unit 50 is acquired, the voltage is stored in the storage unit 110, and when the difference between the latest acquired voltage and the stored voltage is smaller than the third threshold, parameter estimation is not performed. Therefore, for example, when the OCV-SOC characteristics of the secondary battery unit 50 are flat, the internal resistance is small, and the parameter estimation error is increased because the voltage change is small even when the charge/discharge current flows, parameter update is postponed.

According to the present Embodiment 2, every time a voltage of the secondary battery unit 50 is acquired, the voltage is also stored in the storage unit 110, and when the difference between the latest acquired charge/discharge current and the stored charge/discharge current is smaller than the second threshold, and the difference between the latest acquired voltage and the stored voltage is smaller than the third threshold, parameter estimation is not performed. Therefore, for example, even while charging/discharging is being performed with a constant current, when the parameter estimation error is increased because the voltage change of the secondary battery unit 50 is smaller than a certain threshold, parameter update is postponed. In other words, even while charging/discharging is being performed with a constant current, when the voltage change of the secondary battery unit 50 has become greater than a certain threshold, parameter estimation is actively performed.

REFERENCE SIGNS LIST 100 battery monitoring device
101 control unit
102 voltage acquisition unit
103 current acquisition unit
104 temperature acquisition unit
105 internal parameter estimation unit
106 current integration unit
107 state-of-charge calculation unit
108 cell balance adjustment unit
109 timer
110 storage unit
111 current determination unit
112 state-of-charge estimation unit
11, 12 relay
13 inverter
14 motor
15 DC/DC converter
16 battery
17 electric load
18 starting switch
19 charger
50 secondary battery unit
50a voltage detection line
50b current detection line
50c temperature detection line
51 cell
52 voltage sensor
53 current sensor
54 temperature sensor

The invention claimed is:

1. A parameter estimation system configured to estimate a parameter of an equivalent circuit model of a secondary battery, the parameter estimation system comprising:
   a voltage sensor configured to output a voltage signal indicating a voltage of the secondary battery;
   a current sensor configured to output a current signal indicating a charge/discharge current of the secondary battery;
   a voltage acquisition unit configured to acquire the voltage signal in a time-series manner;
   a current acquisition unit configured to acquire the current signal in a time-series manner;
   a storage unit configured to store therein the charge/discharge current indicated by the current signal;
   a first calculation unit configured to receive the current signal and to calculate a difference between the charge/discharge current indicated by the received current signal and the charge/discharge current stored in the storage unit;

an estimation unit configured to receive the voltage signal and the current signal and to estimate the parameter on the basis of the voltage indicated by the voltage signal and the charge/discharge current indicated by the current signal; and a prohibition unit configured to record, in a memory, prohibition data so as to prohibit the estimation of the parameter performed by the estimation unit when an absolute value of the charge/discharge current is smaller than a first threshold, wherein the prohibition unit is further configured to record the prohibition data in the memory when (i) the absolute value of the charge/discharge current is not smaller than the first threshold and (ii) the difference calculated by the first calculation unit is smaller than a second threshold, and not record the prohibition data in the memory when (i) the absolute value of the charge/discharge current is not smaller than the first threshold and (ii) the difference calculated by the first calculation unit is not smaller than the second threshold.

2. The parameter estimation system according to claim 1, wherein the storage unit stores therein the voltage indicated by the voltage signal, the parameter estimation system further comprises a second calculation unit configured to receive the voltage signal and to calculate a difference between the voltage indicated by the received voltage signal and the voltage stored in the storage unit, and the prohibition unit records the prohibition data in the memory when the difference calculated by the second calculation unit is smaller than a third threshold.

3. The parameter estimation system according to claim 2, wherein the prohibition unit records the prohibition data in the memory when the difference calculated by the first calculation unit is smaller than the second threshold and the difference calculated by the second calculation unit is smaller than the third threshold.

4. The parameter estimation system according to claim 1, wherein the equivalent circuit model is represented by a combination of a resistor and a capacitor.

5. The parameter estimation system according to claim 1, wherein the estimation unit estimates the parameter according to a recursive least squares method.

6. The parameter estimation system according to claim 1, wherein the estimation unit estimates the parameter by using a Kalman filter.

7. A parameter estimation method for estimating a parameter of an equivalent circuit model of a secondary battery, the parameter estimation method comprising the steps of:

outputting, using a voltage sensor, a voltage signal indicating a voltage of the secondary battery;

outputting, using a current sensor, a current signal indicating a charge/discharge current of the secondary battery;

acquiring the voltage signal in a time-series manner;

acquiring the current signal in a time-series manner;

storing the charge/discharge current indicated by the current signal;

receiving the current signal and calculating a difference between the charge/discharge current indicated by the received current signal and the stored charge/discharge current;

receiving the voltage signal and the current signal, and estimating the parameter on the basis of the voltage indicated by the voltage signal and the charge/discharge current indicated by the current signal; and recording, in a memory, prohibition data so as to prohibit the estimating of the parameter, wherein the prohibition data is recorded in the memory when an absolute value of the charge/discharge current is smaller than a first threshold, the prohibition data is recorded in the memory when (i) the absolute value of the charge/discharge current is not smaller than the first threshold and (ii) the calculated difference is smaller than a second threshold, and the prohibition data is not recorded in the memory when (i) the absolute value of the charge/discharge current is not smaller than the first threshold and (ii) the calculated difference is not smaller than the second threshold.

* * * * *